United States Patent [19]
Yamamoto et al.

[11] Patent Number: 5,540,999
[45] Date of Patent: Jul. 30, 1996

[54] ELELEMENT USING POLYTHIOPHENE

[75] Inventors: Takakazu Yamamoto, 26-18, Eda-minami 4-chome, Midori-ku, Yokohama-shi, Kanagawa; Takaki Kanbara, Yokohama; Tetsushi Inoue; Kenji Nakaya, both of Chiba, all of Japan

[73] Assignees: Takakazu Yamamoto, Yokohama; TDK Corporation, Tokyo, both of Japan

[21] Appl. No.: 303,736

[22] Filed: Sep. 9, 1994

[30] Foreign Application Priority Data

Sep. 9, 1993 [JP] Japan .................................. 5-248629
Jun. 29, 1994 [JP] Japan .................................. 6-170312

[51] Int. Cl.$^6$ .................................................. B32B 27/00
[52] U.S. Cl. ...................... 428/411.1; 428/212; 428/690; 428/704; 428/917; 428/457; 313/503; 313/504; 313/506
[58] Field of Search .................................. 428/690, 917, 428/704, 212, 411.1, 457; 313/503, 504, 506; 252/301.32, 301.35

[56] References Cited

U.S. PATENT DOCUMENTS

| | | | |
|---|---|---|---|
| 4,720,432 | 1/1988 | Van Slyke et al. | |
| 5,128,587 | 7/1992 | Skotheim et al. | 313/504 |
| 5,142,343 | 8/1992 | Hosokawa et al. | 357/17 |
| 5,247,190 | 9/1993 | Friend et al. | 257/40 |
| 5,317,169 | 5/1994 | Nakano et al. | 257/40 |
| 5,338,788 | 10/1994 | Kawamura et al. | 428/446 |
| 5,343,050 | 8/1994 | Egusa et al. | 257/40 |

FOREIGN PATENT DOCUMENTS

| | | |
|---|---|---|
| 63-295695 | 12/1988 | Japan . |
| 2-207488 | 8/1990 | Japan . |
| 2-250292 | 10/1990 | Japan . |
| 2-291696 | 12/1990 | Japan . |
| 3-114197 | 5/1991 | Japan . |
| 3-190088 | 8/1991 | Japan . |
| 3-289090 | 12/1991 | Japan . |
| 4-178487 | 6/1992 | Japan . |
| 4-334894 | 11/1992 | Japan . |
| 4-357694 | 12/1992 | Japan . |
| 5-78655 | 3/1993 | Japan . |
| 5-182762 | 7/1993 | Japan . |

OTHER PUBLICATIONS

Japanese Journal of Applied Physics, vol. 25, No. 9, Sep. 1986, S. Hayashi et al., "Electroluminescence of Perylene Films with a Conducting Polymer as an Anode", pp. L773–L775.

Database WPI, Derwent Publications Ltd., AN 93–200705 &JP–A–5 125 360, May 21, 1993.

Database WPI, Derwent Publications Ltd., AN 93–297889 & JP–A–5 209 172, Aug. 20, 1993.

Database WPI, Derwent Publications Ltd., AN 93–365489 & JP–A–5 271 652, Oct. 19, 1993.

Extended Abstracts of the 54th Autumn Meeting, 1993, of the Japan Society of Applied Physics, 29p-ZC-7, 1993, T. Fujii, et al., "Characteristics of Organic EL Cells Based on Doped Hole Transport Layer", p. 1124.

Preprint of Workshop 92 of the Japanese Research Association for Organic Electronics Material (JOEM), 31, 1992, Sato, et al., pp. 31–39.

Extended Abstracts of the 39th Spring Meeting, 1992 of The Japan Society of Applied Physics and Related Societies, 28p–Q–8, 1992, H. Kanai, et al., p. 1036, "Characteristics of the Organic EL Device Doped With Rubbene".

(List continued on next page.)

Primary Examiner—Patrick Ryan
Assistant Examiner—Marie R. Yamnitzky
Attorney, Agent, or Firm—Oblon, Spivak, McClelland, Maier, & Neustadt, P.C.

[57] ABSTRACT

An electroluminescent element includes an organic compound layer formed of a thiophene polymer as a light emitting layer or a hole injection transport layer. The element emits light at high luminance and is reliable.

18 Claims, 3 Drawing Sheets

OTHER PUBLICATIONS

Polymer Preprints, Japan, vol. 40, No. 10, 1991, H. Wakayama, et al., "Electrical Properties of Vacuum Deposited Poly(Arylene) Films and its Application for Electronic Devices", pp. 3796–3799.

Polymer Journal, vol 22, No. 2, pp. 187–190, T. Yamamoto, et al., "New Method For The Preparation Of Poly(2,5-Thienylene), Poly(p-Phenylene), and Related Polymers", 1990.

Bull. Chem. Soc. Jpn., vol. 56, No. 5, May 1983, T. Yamamoto, et al., "Preparation and Characterization of Poly(Thienylene)S", pp. 1497–1502.

Macromolecules, vol. 25, No. 4, 1992, T. Yamamoto, et al., pp. 1214–1223, "Preparation of π-Conjugated Poly-(Thiophene-2,5-Diyl), Poly(P-Phenylene), and Related Polymers Using Zerovalent Nickel Complexes. Linear Structure and Properties of the π-Conjugated Polymers".

Bull. Chem. Soc. Jpn., vol. 56, pp. 1503–1507, 1983, Takakazu Yamamoto, et al., "Formation of Adducts of Poly(Thienylene)S With Electrom Acceptors and Electric Conductivities of the Adducts".

Jpn. J. Appl. Phys., vol. 33, 1994, pp. L250–L253, T. Yamamoto, et al., "Polymer Light–Emitting Diodes with Single– and Double–Layer Structures Using Poly (2,3–Diphenylquinoxaline–5,8–Diyl)".

Journal of Polymer Science: Polymer Letters Edition, vol. 20, pp. 365–371, 1982, "Preparation of Copolymers Composed of 2,5–thienylene and 2,4–Thienylene Units. Effect of Copolymer Composition on Electronic Spectrum, Electric Conductivity, and Chemical Properties".

Preprint of the Japanese Polymer Society's 41st Annual Meeting in 1992, IL–29, vol. 41, No. 3, T. Fukuda, et al., "Electroluminescence of Vacuum Evaporated Organic Thin Films", p. 804.

ELELEMENT USING POLYTHIOPHENE

This invention relates to an electroluminescent (EL) element using polythiophene and more particularly, to an electroluminescent element having layered thin films of organic compounds and adapted to emit light upon application of an electric field thereacross.

BACKGROUND OF THE INVENTION

Organic electroluminescent (EL) elements include a thin film containing a luminescent organic compound interposed between a cathode and an anode. Electrons and holes are injected into the thin film where they are recombined to create excitons. Light is emitted by utilizing luminescence (phosphorescence or fluorescence) upon deactivation of excitons. The organic EL elements are characterized by plane light emission at a high luminance of about 100 to 10,000 cd/m$^2$ with a low voltage of about 10 volts and light emission in a spectrum from blue to red color by a simple choice of the type of fluorescent material.

The organic EL elements, however, are undesirably short in effective life, less durable and less reliable because of the following factors.

(1) Physical changes of organic compounds: Growth of crystal domains renders the interface non-uniform, which causes deterioration of electric charge injection ability, short-circuiting and dielectric breakdown of the element. Particularly when a low molecular weight compound having a molecular weight of less than 500 is used, crystal grains develop and grow, substantially detracting from film quality. Even when the interface with ITO is rough, significant development and growth of crystal grains occur to lower luminous efficiency and allow current leakage, ceasing to emit light. Local dark spots are also formed.

(2) Oxidation and stripping of the cathode: Although metals having a low work function such as Na, Mg and Al are used as the cathode in order to facilitate electron injection, these metals are reactive with oxygen and moisture in air. As a result, the cathode can be stripped from the organic compound layer, prohibiting electric charge injection. Particularly when a polymeric compound is applied by spin coating, the residual solvent and decomposed products resulting from film formation promote oxidative reaction of the electrodes which can be stripped to create local dark spots.

(3) Low luminous efficiency and increased heat build-up: Since electric current is conducted across an organic compound, the organic compound must be placed under an electric field of high strength and cannot help heating. The heat causes melting, crystallization or decomposition of the organic compound, leading to deterioration or failure of the element.

(4) Photochemical and electro-chemical changes of organic compound layers.

To solve problem (1), low molecular weight amorphous compounds and high molecular weight compounds have been studied. The low molecular weight compounds can be deposited by evaporation, but the resulting thin films are unstable. The high molecular weight compounds can form stable thin films, but suffer from a serious problem of application because they cannot be deposited by evaporation in forming a layer structure. Since they are coated as by spin coating, the residual solvent and impurities can be incorporated into the resulting film to invite substantial deterioration of the electrodes and high molecular weight compounds. High molecular weight compounds which can be deposited by evaporation were recently reported (see Fukuda et al., Preprint of the Japanese Polymer Society's 41st Annual Meeting in 1992, IL-29), but are still unsuccessful in providing emission at a practically acceptable luminance.

The transparent electrodes used heretofore are of ITO glass or the like because they must have a low surface resistivity of less than 10 to 30 $\Omega$/□. However, observation under a scanning tunnel microscope (STM) or atomic force microscope (AFM) indicates irregularities of the order of 200 Å on sputtered substrates and of the order of 400 Å on EB evaporated substrates. There is also surface roughening due to damage during ITO patterning. Therefore, the prevailing situation is likely to promote crystallization of an organic thin film.

Solutions in this respect include provision of a phthalocyanine film on the ITO surface (see JP-A 295695/1988) and spin coating of polyarylene vinylene. However, the phthalocyanine is microcrystalline and is not always effective. The polyarylene vinylene can damage ITO with an acid generated upon conversion and promote oxidation of the electrodes by residual solvent or the like. A fill of polyarylene vinylene is non-uniform because of spin coating. All these fail to improve element reliability.

Therefore, there is a need for an organic compound which can solve the above-mentioned problems.

For the purpose of improving element performance, EL elements having a mix layer consisting of a mixture of two or more compounds having distinct functions were also proposed. For example, JP-A 250292/1990 discloses that a thin film of layered structure or a mix thin film prepared from an organic compound having hole transport and light emitting functions and another organic compound having an electron transport function is used as a light emitting layer for the purpose of improving luminance and durability. JP-A 291696/1990 discloses to use a thin film of a mixture of an organic compound having a hole transport function and a fluorescent organic compound having an electron transport function as a light emitting layer. JP-A 114197/1991 discloses to interpose a mix layer of a mixture of an electric charge injecting material and an organic fluorescent material between an electric charge injecting layer and a light emitting layer for the purpose of improving luminous efficiency and luminance. JP-A 190088/1991 discloses to interpose between a hole transport layer and/or an electron transport layer and an organic light emitting layer a mix layer containing the components of the opposed layers for the purpose of facilitating injection of holes and electrons into the light emitting layer. JP-A 334894/1992 discloses that when a plurality of organic compound layers are formed, a layer in which compounds of distinct functions are co-present is formed, for example, a layer containing a hole transporting luminescent material and a layer in which a hole transporting luminescent material and an electron transporting material are co-present are formed, thereby increasing luminance, providing a variety of emission color hues and improving durability. JP-A 182762/1993 discloses to form a mix layer of a mixture of a luminescent material and an electric charge injecting material between a light emitting layer and an electric charge injecting layer, thereby lowering the drive voltage. JP-A 289090/1991 discloses to form a thin film of a mixture of a hole conducting organic compound and an organic complex of a rare earth metal as a light emitting layer, achieving a narrow luminous spectrum, monochromaticity, and high conversion efficiency. JP-A 178487/1992 and 78655/1993 discloses high luminance full-color elements which are obtained by forming a thin film layer of a mixture of an organic charge material and an organic luminescent material as an organic luminescent thin film layer, thereby preventing concentration extinction and increasing the available range of luminescent material. Moreover, JP-A 357694/1992 discloses to form layers of graded structure in which a concentration gradient is provided between adjacent layers by components of respective layers, thereby lowering the drive voltage and improving durability.

Also organic compound layers doped with rubrene were proposed. Typical examples of known organic compound layers doped with rubrene are found in organic EL elements comprising a hole transport layer in the form of a film of a mixture of hydrazine derivatives and a light emitting layer of tris(8-quinolinolato)aluminum as organic compound layers wherein the hole transport layer is doped with rubrene or a half portion of the hole transport layer disposed on the organic interface and the entire light emitting layer are doped with rubrene. It was reported that in the element having the hole transport layer doped with rubrene, light emission takes place from both tris(8-quinolinolato)aluminum and rubrene and that in the element having a half portion of the hole transport layer and the light emitting layer doped with rubrene, luminous efficiency is improved and the increase of dark spots during shelf storage is suppressed. See Kanai, Yajima & Sato, Extended Abstracts of the 39th Spring Meeting, 1992 of The Japan Society of Applied Physics and Related Societies, 28p-Q-8 (1992) and Sato & Kanai, Preprint of Workshop 92 of the Japanese Research Association for Organic Electronics Materials (JOEM), 31 (1992). A hole transport layer of triphenyldiamine derivative (TPD) doped with rubrene was also proposed as having an improved luminance half-life. See Fujii, Sano, Fujita, Hamada & Shibata, Extended Abstracts of the 54th Autumn Meeting, 1993 of The Japan Society of Applied Physics, 29p-ZC-7 (1993).

Moreover, JP-A 207488/1990 discloses an element comprising a p-type inorganic semiconductor thin film layer and an organic compound thin film layer consisting essentially of rubrene, the element providing satisfactory luminance and stability thereof.

None of the foregoing EL elements are satisfactory in luminous life.

SUMMARY OF THE INVENTION

An object of the present invention is to provide an EL element which uses an photo-electronic functional material having minimal physical changes, photochemical changes and electro-chemical changes as a hole injection transport material or a luminescent material and a polythiophene, the element having high reliability and luminous efficiency and providing emission of various colors.

Another object of the present invention is to provide a high reliability, high luminance light emitting element using an organic thin film formed by evaporating a high molecular weight compound, thereby suppressing voltage rise, current leakage, and development or growth of local dark spots during driving of the element.

A further object is to provide an EL element using polythiophene and having an extended emission life and a minimized initial drop of luminance.

According to a first aspect of the invention, there is provided an electroluminescent (EL) element comprising at least one layer containing a thiophene polymer having a structural unit of the following formula (1) (often referred to as polymer I) or a thiophene copolymer having a structural unit of the following formula (1) and a structural unit of the following formula (2) (often referred to as copolymer II) or both. The polymer I and copolymer II have an average degree of polymerization of 4 to 100 and are terminated with a hydrogen or halogen atom.

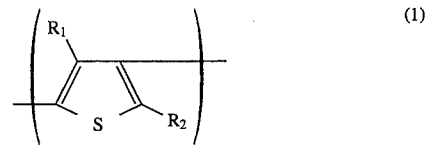

Each of $R_1$ and $R_2$, which may be identical or different, is a hydrogen atom, an aromatic hydrocarbon group or an aliphatic hydrocarbon group.

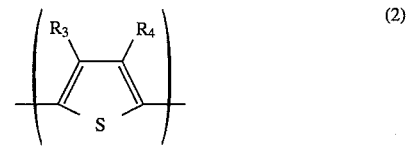

Each of $R_3$ and $R_4$, which may be identical or different, is a hydrogen atom, an aromatic hydrocarbon group or an aliphatic hydrocarbon group, or $R_3$ and $R_4$ taken together may form a ring.

Preferably, the at least one layer is formed by vacuum evaporation of a selected polymer. Preferably it is a light emitting layer or a light emitting layer which also serves as a hole injection transport layer.

Preferably, the EL element further includes a hole injection transport layer and a light emitting layer, the hole injection transport layer containing the thiophene polymer I or copolymer II or both. The EL element may further include another hole injection transport layer in addition to the hole injection transport layer containing the thiophene polymer I or copolymer II or both. The EL element may further include an electron injection transport layer.

According to a second aspect of the invention, there is provided an EL element comprising a hole injection transport layer and a light emitting layer, the hole injection transport layer containing at least one thiophene polymer of the following formula (3) (often referred to as polymer III).

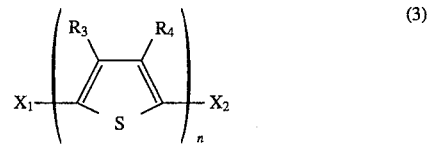

Each of $R_3$ and $R_4$, which may be identical or different, is a hydrogen atom, an aromatic hydrocarbon group or an aliphatic hydrocarbon group, or $R_3$ and $R_4$ taken together may form a ring; each of $X_1$ and $X_2$, which may be identical or different, is a hydrogen or halogen atom; and letter n is a number from 4 to 100.

Preferably, the layer containing at least one thiophene polymer III is formed by vacuum evaporation of the polymer.

The EL element may include another hole injection transport layer in addition to the hole injection transport layer containing at least one thiophene polymer III. The EL element may further include an electron injection transport layer.

Preferably, the EL element of the first and second aspects includes at least one first layer containing a hole injection transport compound and at least one second layer containing an electron injection transport compound, the difference in ionization potential Ip or the difference in electron affinity Ea between the hole injection transport compound and the electron injection transport compound in the layers or both being at least 0.2 eV. More preferably, the first layer is placed on the hole injection transport layer containing at least one polythiophene, and the second layer is placed on the first layer.

Preferably, the EL element of the first and second aspects further includes at least one mix layer containing a mixture of a hole injection transport compound and an electron injection transport compound. The mix layer is typically a light emitting layer. Preferably, the difference in ionization potential Ip or the difference in electron affinity Ea between the hole injection transport compound and the electron injection transport compound in the mix layer or both is at least 0.2 eV. The hole injection transport compound preferably has an ionization potential Ip of up to 5.4 eV in absolute value. The preferred electron injection transport compound is tris(8-quinolinolato)aluminum.

Preferably, the EL element of the first and second aspects further includes a layer doped with a luminescent material which is typically rubrene.

BENEFITS OF THE INVENTION

The EL element of the present invention uses a thiophene polymer having a structural unit of formula (1), that is, polymer I or a thiophene copolymer having structural units of formulae (1) and (2), that is, copolymer II or both as a luminescent material or hole injection transport material according to the first aspect and a thiophene polymer of formula (3), that is polymer III as a hole injection transport material according to the second aspect to form a light emitting layer or hole injection transport layer.

All these thiophene polymers include a five-membered ring with excessive π-electrons and hence, have a low ionization potential and a very high hole injecting ability so that when used as a hole material, they are effective for lowering a drive voltage. Due to relatively linear molecules themselves, the thiophene polymers have a short intermolecular distance in film form so that they have high hole mobility and great hole transport ability. Then by controlling the thickness of a light emitting layer, electron injection transport layer or hole injection transport layer to be combined, the freedom of design of a recombination region is increased to allow for designing of a luminous spectrum, control of luminance by interference of the opposed electrodes, and control of the space distribution of a luminescent region in the element.

Therefore, the polymers may be used in the light emitting layer or hole injection transport layer as desired. Particularly when the polymers are used in the hole injection transport layer, a high luminance of about 100 to 1,000 cd/m$^2$ or more is achieved in a stable manner. Heat resistance and durability are high enough to allow for stable operation of the element even at a current density as high as about 1,000 mA/cm$^2$.

Since the polymers form substantially amorphous thin films of quality, they ensure uniform light emission without variations.

The EL elements of the invention provide efficient light emission at a low voltage.

The EL elements of the invention emit light at a maximum wavelength in the range of about 350 to 700 nm. Particularly when at least one of polymer I and copolymer II is used as a luminescent material in a light emitting layer, the luminous maximum wavelength can be freely controlled in the range of 400 to 700 nm by selecting a degree of polymerization, linkage position, and type of substituent. Then blue color emission is achievable in a stable manner.

Note that Fukuda et al., Preprint of the Society of Polymer Science, Japan, 41st Annual Meeting in 1992, IL-29 reports an EL element using as a light emitting layer a vacuum evaporated layer of poly(thiophene-2,5-diyl) which is the same as polymer III defined herein. This report uses poly(thiophene-2,5-diyl) as a luminescent material, but indicates nowhere the construction of the present invention that another fluorescent material is used in a light emitting layer and poly(thiophene-2,5-diyl) is used in a hole injection transport layer which is formed separately from the light emitting layer. We have first discovered the effective use of poly(thiophene-2,5-diyl) in a hole injection transport layer.

BRIEF DESCRIPTION OF THE DRAWINGS

The foregoing aspects and other features of the invention are explained in the following description, taken in connection with the accompanying drawings where.

DETAILED DESCRIPTION OF THE INVENTION

Figure 1:
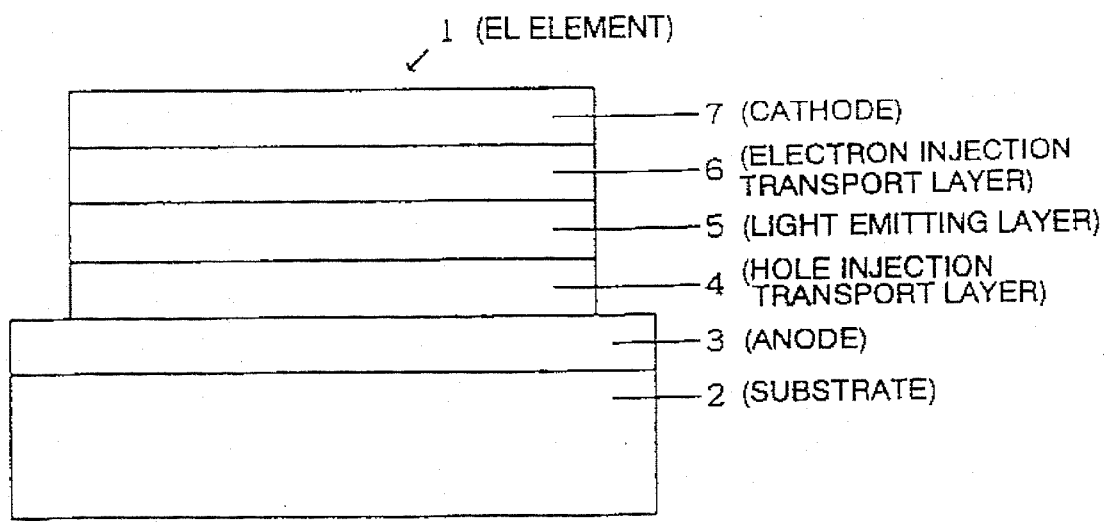
FIG. 1 is a side elevation of an exemplary organic EL element according to one embodiment of the invention.

The EL element of the invention uses a polythiophene of a specific structure, that is, polymer I, copolymer II or polymer III. Polymer I and copolymer II are used in a light emitting layer or a hole injection transport layer whereas polymer III is used in a hole injection transport layer.

First thiophene polymer I is described. Polymer I has a structural unit of formula (1). For example, polymer I is represented by the following formula (4).

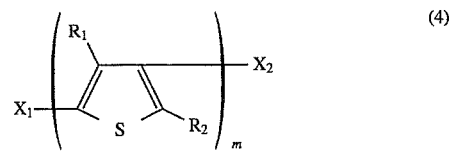

(4)

In formulae (1) and (4), each of $R_1$ and $R_2$ is a hydrogen atom, an aromatic hydrocarbon group or an aliphatic hydrocarbon group while $R_1$ and $R_2$ may be identical or different. The aromatic hydrocarbon group represented by $R_1$ and $R_2$ may be substituted or unsubstituted ones and preferably have 6 to 15 carbon atoms. Exemplary substituents, if any, are alkyl, alkoxy, amino and cyano groups. Exemplary aromatic hydrocarbon groups include phenyl, tolyl, methoxyphenyl, biphenyl and naphthyl groups. The aliphatic hydrocarbon group represented by $R_1$ and $R_2$ include alkyl and cycloalkyl groups which may be substituted or unsubstituted ones. Preferred are those groups having 1 to 6 carbon atoms, for example, methyl, ethyl, i-propyl and t-butyl groups. Preferably $R_1$ and $R_2$ are hydrogen atoms or aromatic hydrocarbon groups, with hydrogen being most preferred.

Polymer I in the layer has an average degree of polymerization, represented by m in formula (4), of 4 to 100, preferably 5 to 40, more preferably 5 to 20. Polymer I may be either a homopolymer consisting of identical recurring units of formula (1) or a copolymer consisting essentially of recurring units of formula (1) having different combinations of $R_1$ and $R_2$. The copolymer may be any of random, alternate and block copolymers. Polymer I in the layer preferably has a weight average molecular weight of about 300 to about 10,000.

Polymer I is terminated with terminal groups, represented by $X_1$ and $X_2$ in formula (4), which are hydrogen atoms or halogen atoms such as chlorine, bromine and iodine. The terminal groups introduced generally depend on the starting material from which polymer I is synthesized. Alternatively, a suitable substituent may be introduced at the final stage of polymerization reaction.

Preferably polymer I consists of structural units of formula (1) although it may contain less than 10 mol % of another monomeric component.

Some illustrative, preferred examples of polymer I is shown below by picking up the combination of $R_1$ and $R_2$ in formula (1) or (4).

TABLE 1

| Polymer | $R_1$ | $R_2$ | |
|---|---|---|---|
| I-1 | H | H | homopolymer |
| I-2 | H | Ph | homopolymer |
| I-3 | Ph | H | homopolymer |
| I-4 | Ph | Ph | homopolymer |
| I-5 | H | $CH_3$ | homopolymer |
| I-6 | H | $t$-$C_4H_9$ | homopolymer |

Next thiophene copolymer II is described. Copolymer II has structural units of formulae (1) and (2). For example, copolymer II is represented by the following formula (5).

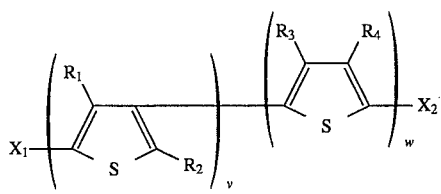
(5)

In formula (5), $R_1$ and $R_2$ are as defined above for formula (1).

In formulae (2) and (5), each of $R_3$ and $R_4$ is a hydrogen atom, an aromatic hydrocarbon group or an aliphatic hydrocarbon group while $R_3$ and $R_4$ may be identical or different. Examples of the aromatic and aliphatic hydrocarbon groups represented by $R_3$ and $R_4$ are the same as enumerated for $R_1$ and $R_2$, with their preferred examples being also the same. Further $R_3$ and $R_4$ taken together may form a ring which is fused to the thiophene ring. A benzene ring is a typical fused ring.

Like polymer I, copolymer II in the layer has an average degree of polymerization, represented by v+w in formula (5), of 4 to 100, preferably 5 to 40, more preferably 5 to 20. The molar ratio of the structural unit of formula (1) to the structural unit of formula (2) may range from about 10/1 to about 1/10. Copolymer II in the layer preferably has a weight average molecular weight of about 300 to about 10,000.

Copolymer II is terminated with terminal groups, represented by $X_1$ and $X_2$ in formula (5), which are hydrogen atoms or halogen atoms as in polymer I. The terminal groups generally depend on the starting materials from which copolymer II is synthesized.

Preferably copolymer II consists of structural units of formulae (1) and (2) although it may contain less than 10 mol % of another monomeric component. Copolymer II may be any of random, alternate and block copolymers, which are all encompassed by the structural formula (5). The structural units of each of formulae (1) and (2) may be identical or different.

Some illustrative, preferred examples of copolymer II is shown below by picking up the combination of $R_1$, $R_2$, $R_3$ and $R_4$ in formula (5).

TABLE 2

| | Copolymer II | | | |
|---|---|---|---|---|
| Copolymer | $R_1$ | $R_2$ | $R_3$ | $R_4$ |
| II-1 | H | H | H | H |
| II-2 | H | $CH_3$ | H | H |
| II-3 | H | Ph | H | H |
| II-4 | H | Ph | Ph | Ph |

Next thiophene polymer III is described. Polymer III is represented by formula (3) wherein $R_3$ and $R_4$ are as defined for formula (2), with their preferred examples being also the same.

$X_1$ and $X_2$ represent terminal groups and may be either identical or different. Like the terminal groups of polymer I and copolymer II, the terminal groups represented by $X_1$ and $X_2$ are hydrogen atoms or halogen atoms such as chlorine, bromine and iodine. The terminal groups $X_1$ and $X_2$ generally depend on the starting material from which polymer III is synthesized.

Like polymer I and copolymer II, polymer III in the layer has an average degree of polymerization, represented by n in formula (3), of 4 to 100, preferably 5 to 40, more preferably 5 to 20. Polymer III may be either a homopolymer consisting of recurring units having an identical combination of $R_3$ and $R_4$ or a copolymer consisting essentially of recurring units having different combinations of $R_3$ and $R_4$. The copolymer may be any of random, alternate and block copolymers. Polymer III in the layer preferably has a weight average molecular weight of about 300 to about 10,000.

Preferably polymer III is of the structure shown by formula (3) although it may contain less than 10 mol % of another monomeric component like polymer I and copolymer II.

Some illustrative, preferred examples of polymer III is shown below by picking up the combination of $R_3$ and $R_4$ in formula (3).

TABLE 3

| | Polymer III | | |
|---|---|---|---|
| Copolymer | $R_3$ | $R_4$ | |
| III-1 | H | H | homopolymer |
| III-2 | H | Ph | homopolymer |
| III-3 | Ph | Ph | homopolymer |
| III-4 | H | 4-methoxyphenyl | homopolymer |
| III-5 | $CH_3$ | $CH_3$ | homopolymer |
| III-6 | H | $CH_3$ | homopolymer |

Polymer I, copolymer II and polymer III of the invention can be prepared by condensation polymerization of dihalogenated aryl compounds. More particularly, the polymers are synthesized by (1) polymerizing dihalogenated aryl in the presence of a nickel complex such as dichloro(2,2'-bipyridine) nickel [$NiCl_2$(bpy)] according to Grignard reaction (see Yamamoto T., et al., Bull. Chem. Soc. Jpn., 56, 1497 (1983)) or (2) effecting polymerization in the presence of a nickel complex such as bis(1,5-cyclooctadiene)nickel [Ni(cod)$_2$] (see Yamamoto T., et al., Polym. J., 22, 187 (1990)).

These polymers can be identified by elemental analysis, infrared absorption spectroscopy (IR), nuclear magnetic resonance spectroscopy (NMR), etc. The average degree of polymerization and weight average molecular weight can be determined by optical scattering method, gel permeation chromatography (GPC), liquid chromatography, mass spectroscopy, etc. Most polymers have a melting point of higher than 300° C. and some have no melting point. They can be evaporated and deposited in vacuum to form amorphous or microcrystalline thin films of quality.

Synthetic examples of these polymers are given below together with the results of elemental analysis.

Synthesis Example 1

Synthesis of poly(thiophene-2,4-diyl) or Polymer I-1 terminated with H or Br

In a nitrogen atmosphere, 1.58 g (5.71 mmol) of bis(1,5-cyclooctadiene)nickel [Ni(cod)$_2$], 0.90 g (5.75 mmol) of 2,2'-bipyridine, and 1.0 ml of 1,5-cyclooctadiene were mixed with 50 ml of N,N-dimethylformamide. 1.15 g (4.76 mmol) of 2,4-dibromothiophene was added to the mixture, which was agitated at 60° C. for 18 hours. There was precipitated a reddish brown polymer. The nickel compound and other impurities were removed from the polymer by washing the product with a hydrochloric acid-ethanol solution, an ethylenediamine aqueous solution, toluene, hot water, and then ethanol. The yield was 91%.

|  | Elemental analysis | | | | |
|---|---|---|---|---|---|
|  | C | H | S | Br | |
| Calcd. (%) | 58.5 | 2.45 | 39.55 | 0.0 | $(C_4H_2S)_n$ |
| Found (%) | 57.07 | 2.07 | 35.50 | 5.56 | |

Synthesis Example 2

Synthesis of poly(thiophene-2,5-diyl) or Polymer III-1 terminated with H or Br

In a nitrogen atmosphere, 1.58 g (5.71 mmol) of bis(1,5-cyclooctadiene)nickel [Ni(cod)$_2$], 0.90 g (5.75 mmol) of 2,2'-bipyridine, and 1.0 ml of 1,5-cyclooctadiene were mixed with 50 ml of N,N-dimethylformamide. 1.15 g (4.76 mmol) of 2,5-dibromothiophene was added to the mixture, which was agitated at 60° C. for 18 hours. There was precipitated a reddish brown polymer. The nickel compound and other impurities were removed from the polymer by washing the product with a hydrochloric acid-ethanol solution. The yield was 98%.

|  | Elemental analysis | | | | |
|---|---|---|---|---|---|
|  | C | H | S | Br | |
| Calcd. (%) | 58.5 | 2.45 | 39.55 | 0.0 | $(C_4H_2S)_n$ |
| Found (%) | 53.45 | 2.32 | 35.84 | 6.39 | |

Synthesis Example 3

Synthesis of poly(3-phenylthiophene-2,4-diyl) or Polymer I-3 terminated with H or Br In a nitrogen atmosphere, 1.58 g (5.71 mmol) of bis(1,5-cyclooctadiene)nickel [Ni(cod)$_2$], 0.90 g (5.75 mmol) of 2,2'-bipyridine, and 1.0 ml of 1,5-cyclooctadiene were mixed with 50 ml of N,N-dimethylformamide. 1.19 g (5.0 mmol) of 2,4-dibromo-3-phenylthiophene was added to the mixture, which was agitated at 60° C. for 18 hours. There was precipitated a pale brown polymer. The nickel compound and other impurities were removed from the polymer by washing the product with a hydrochloric acid-ethanol solution, an ethylenediamine aqueous solution, toluene, hot water, and then ethanol. The yield was 90%.

|  | Elemental analysis | | | | |
|---|---|---|---|---|---|
|  | C | H | S | Br | |
| Calcd. (%) | 75.8 | 3.8 | 20.2 | 0.0 | $(C_{10}H_6S)_n$ |
| Found (%) | 74.5 | 3.7 | 18.6 | 3.0 | |

Synthesis Example 4

Synthesis of poly(3,4-dimethylthiophene-2,5-diyl) or Polymer III-5 terminated with H or Br In a nitrogen atmosphere, 1.58 g (5.71 mmol) of bis(1,5-cyclooctadiene)nickel [Ni(cod)$_2$], 0.90 g (5.75 mmol) of 2,2'-bipyridine, and 1.0 ml of 1,5-cyclooctadiene were mixed with 50 ml of N,N-dimethylformaide. 1.40 g (5.2 mmol) of 2,5-dibromo-3,4-dimethylthiophene was added to the mixture, which was agitated at 60° C. for 18 hours. There was precipitated an orange colored poller. The nickel compound and other impurities were removed from the polymer by washing the product with a hydrochloric acid-ethanol solution, an ethylenediamine aqueous solution, toluene, hot water, and then ethanol. The yield was 80%.

|  | Elemental analysis | | | | |
|---|---|---|---|---|---|
|  | C | H | S | Br | |
| Calcd. (%) | 65.4 | 5.48 | 29.1 | 0.0 | $(C_6H_6S)_n$ |
| Found (%) | 65.1 | 5.51 | 27.0 | 2.0 | |

Synthesis Example 5

Synthesis of thiophene-2,4-diyl/thiophene-2,5-diyl (1/1) copolymer or Copolymer II-1 terminated with H or Br In a nitrogen atmosphere, 1.58 g (5.71 mmol) of bis(1,5-cyclooctadiene)nickel [Ni(cod)$_2$], 0.90 g (5.75 mmol) of 2,2'-bipyridine, and 1.0 ml of 1,5-cyclooctadiene were mixed with 50 ml of N,N-dimethylformamide. 0.63 g (2.6 mmol) of 2,5-dibromothiophene and 0.63 g (2.6 mmol) of 2,4-dibromothiophene were added to the mixture, which was agitated at 60° C. for 18 hours. There was precipitated a reddish brown poller. The nickel compound and other impurities were removed from the poller by washing the product with a hydrochloric acid-ethanol solution, an ethylenedivine aqueous solution, toluene, hot water, and then ethanol. The yield was 93%.

| | Elemental analysis | | | | |
|---|---|---|---|---|---|
| | C | H | S | Br | |
| Calcd. (%) | 58.5 | 2.45 | 39.55 | 0.0 | $(C_4H_2S)_n$ |
| Found (%) | 57.1 | 2.10 | 36.2 | 4.0 | |

The remaining exemplary compounds can be synthesized exactly or approximately the same process as above.

The EL element of the invention includes at least one organic compound layer. The organic compound layer or at least one of organic compound layers contains the thiophene polymer defined herein. One exemplary structure of the EL element according to the present invention is shown in FIG. 1. The EL element generally designated at 1 in FIG. 1 includes on a substrate 2, an anode 3, a hole injection transport layer 4, a light emitting layer 5, an electron injection transport layer 6, and a cathode 7 stacked in the described order from bottom to top.

The light emitting layer has multi-functions of injecting holes and electrons, transporting them, and recombining holes and electrons to create excitons. The hole injection transport layer has functions of facilitating injection of holes from the anode, transporting them, and obstructing electron transport. The electron injection transport layer has functions of facilitating injection of electrons from the cathode, transporting them, and obstructing hole transport. These two layers are effective for increasing the number of holes and electrons injected into the light emitting layer and confining holes and electrons therein for optimizing the recombination region to improve light emission efficiency. Therefore the hole and electron injection transport layers are optionally provided by taking into account the magnitude of the respective functions of the compound used in the light emitting layer for electron injection and transport, hole injection and transport. For example, if the compound used in the light emitting layer has an enhanced hole or electron injection transport function, the hole or electron injection transport layer may be omitted because the light emitting layer itself can also serve as a hole or electron injection transport layer. In some cases, both the hole and electron injection transport layers may be omitted. Each of the hole and electron injection transport layers may consist of two sublayers, one sublayer having an injection function and another sublayer having a transport function.

Thiophene polymer I and copolymer II according to the invention are preferably used in the light emitting layer or hole injection transport layer. The polymer may be used solely in either one of the light emitting layer and the hole injection transport layer. Also preferably the polymer is used in the light emitting layer which also serves as the hole injection transport layer, that is, hole injection transport/light emitting layer. As the case may be, the polymer is used in the hole injection transport layer, the light emitting layer, and the light emitting layer which collectively serves as an electron injection transport layer.

On the other hand, polymer III is preferably used in the hole injection transport layer.

First described is the embodiment wherein polymer I and copolymer II according to the invention are used in the light emitting layer. The light emitting layer may additionally contain another luminescent material. The luminescent material may be selected from compounds as disclosed in JP-A 264692/1988, for example, metal complex dyes, coumarin, quinacridone, rubrene, and styryl series dyes alone or in admixture. Typical examples are organic fluorescent substances such as tetraphenylbutadiene, anthracene, perylene, coronene, 12-phthaloperinone derivatives, and tris (8-quinolinolato) aluminum. Such a luminescent material is preferably contained in the light emitting layer in an amount of less than 5 mol % of polymer I or copolymer II. By adding a selected luminescent material, the light emitted by the layer can be shifted to a longer wavelength side.

The light emitting layer may further contain a singlet oxygen quencher. Exemplary quenchers include nickel complexes, rubrene, diphenylisobenzofuran, and tertiary amines. Such a quencher is preferably present in an amount of less than 10 mol % of polymer I or copolymer II.

In the embodiment wherein polymer I and copolymer II are used in the light emitting layer, any of various organic compounds used in conventional organic EL elements, for example, the organic compounds described in JP-A 295695/1988, 191694/1990, and 000792/1991 may be used in the hole injection transport layer and electron injection transport layer. For example, in the hole injection transport layer, any of aromatic tertiary amines, hydrazone derivatives, carbazole derivatives, triazole derivatives, imidazole derivatives, and oxadiazole derivatives having an amino group may be used. For the electron injection transport layer, organic metal complex derivatives such as tris(8-quinolinolato)aluminum, oxadiazole derivatives, pyridine derivatives, pyrimidine derivatives, quinoline derivatives, quinoxaline derivatives, diphenylquinone derivatives, perylene derivatives, and fluorene derivatives may be used.

Moreover, polymer I, copolymer II and polymer III may be used in the hole injection transport layer. It is also preferred to provide a light emitting layer such that it may also serve as a hole injection transport layer rather than separately providing a hole injection transport layer.

Where the hole injection transport layer is formed as comprising a hole injection layer and a hole transport layer, two or more compounds are selected in a proper combination from the compounds commonly used in hole injection transport layers. In this regard, it is preferred to laminate layers such that a layer of a compound having a lower ionization potential may be disposed adjacent to the anode (ITO etc.). It is also preferred to use a compound having good thin film forming ability at the anode surface. This order of lamination also applies where a plurality of hole injection transport layers are provided. Such an order of lamination is effective for lowering drive voltage and preventing current leakage and development and growth of local dark spots. Since evaporation is utilized in manufacturing elements, thin films of about 1 to 10 nm thick can be formed uniform and pinhole-free, which restrains any change in color tone of light emission and a drop of efficiency by re-absorption even if a compound having a low ionization potential and absorption in the visible range is used in the hole injection transport layer.

Where the electron injection transport layer is formed as comprising an electron injection layer and an electron transport layer, two or more compounds are selected in a proper combination from the compounds commonly used in electron injection transport layers. In this regard, it is preferred to laminate layers such that a layer of a compound having a greater electron affinity may be disposed adjacent to the cathode. This order of lamination also applies where a plurality of electron injection transport layers are provided.

Next described is the embodiment wherein thiophene polymer I, copolymer II and polymer III according to the invention are used in the hole injection transport layer. In this embodiment, any of the aforementioned hole injection transport materials can be additionally used in the hole injection transport layer. Alternatively a hole injection transport layer of a thiophene polymer may be laminated with another hole injection transport layer of such a hole injection transport material. More preferably, a first hole injection transport layer using a thiophene polymer is formed on the anode surface and a second hole injection transport layer using another hole injection transport material is placed thereon. This layered structure improves a hole injection transport function and hence, the performance of the element. The layered structure is also effective for covering up irregularities on the surface of the anode (ITO etc.) and stabilizing an organic compound layer to be overlaid.

In the case of the layered structure, aromatic tertiary amines such as tetraphenyldiaminobiphenyl derivatives (TPD) are preferred as a second hole injection transport material. Since these compounds have an ionization potential equal to or greater than the ionization potential of the thiophene polymers according to the invention, a preferred combination can be accomplished by a proper choice of a polymer from the thiophene polymers.

In general, the thiophene polymers according to the invention have an ionization potential of about 4.8 to 5.4 eV and an electron affinity Ea of about 1.8 to 3.0 eV both in absolute value.

Where the thiophene polymer is used in the hole injection transport layer, the fluorescent material used in the light emitting layer may be selected from those capable of fluorescence at a longer wavelength, for example, from those fluorescent materials which are used in combination with polymer I or copolymer II in the light emitting layer. The light emitting layer may be one using tris(8-quinolinolato)aluminum etc. or an electron injection transport/light emitting layer which serves as both a light emitting layer and an electron injection transport layer. Where the thiophene polymer is used in the hole injection transport layer, polymer I or copolymer II may also be used in the light emitting layer. Any of the above-mentioned electron injection transport materials may be used in the electron injection transport layer. The remaining factors are the same as in the embodiment wherein the thiophene polymer is used in the light emitting layer.

The thicknesses of the light emitting layer, hole injection transport layer, and electron injection transport layer are not critical and varies with a particular formation technique. Usually a single layer is about 1 to 1,000 nm thick, especially about 8 to 200 nm.

The thicknesses of the hole injection transport layer and electron injection transport layer are equal to or range from 1/10 to 10 times the thickness of the light emitting layer although they depend on the design of a recombination/light emitting region. When the electron or hole injection transport layer is divided into an injection layer and a transport layer, preferably the injection layer is at least 1 nm thick and the transport layer is at least 20 nm thick. The upper limit of thickness is about 100 nm for the injection layer and about 1,000 nm for the transport layer. These film thickness ranges also apply when two, first and second injection transport layers are formed.

A freedom of design of the recombination/light emitting region is available by controlling the film thicknesses in consideration of the carrier mobility and carrier density (which is dependent on ionization potential and electron affinity) of the light emitting layer, hole injection transport layer, and electron injection transport layer to be combined. This enables free design of luminous color, control of the luminance and spectrum of light emission by the interference of the electrodes, and control of the space distribution of light emission.

Where an electron injection transport compound and a hole injection transport compound are used in combination, that is, in an EL element having a layer containing an electron injection transport compound and a layer containing a hole injection transport compound, the difference in ionization potential Ip or the difference in electron affinity Ea between the electron injection transport compound and the hole injection transport compound or both should preferably be 0.2 eV or more.

When the Ip difference or Ea difference between an electron injection transport compound and a hole injection transport compound is within this range, a layer containing an electron injection transport compound and a layer containing a hole injection transport compound like a combination of an electron injection transport layer and a hole injection transport layer are optimized in energy state or level to enhance the carrier blocking effect at the interface for rendering more improbable the injection of polarly inferior or unstable carriers. Then the organic compounds of the respective layers are less susceptible to damage, and few carrier or exciton deactivation sites are created in the carrier recombination region or light emitting region. As a result, stable light emission is accomplished and the life is substantially extended. If the Ip or Ea difference is too small, less carrier blocking effect is obtained at the interface.

Where either one or each of the layer containing an electron injection transport compound and the layer containing a hole injection transport compound is provided as two or more layers in the above-mentioned embodiment, the above-mentioned relationship may be satisfied between at least one layer containing an electron injection transport compound and at least one layer containing a hole injection transport compound, preferably the relationship be satisfied between more closely disposed such two layers.

Where a layer containing an electron injection transport compound and a layer containing a hole injection transport compound are placed one on the other like a combination of a hole injection transport layer with an electron injection transport/light emitting layer and a combination of an electron injection transport layer with a hole injection transport/light emitting layer, the Ip difference or Ea difference between the electron injection transport compound and the hole injection transport compound in the layers should preferably fall in the above-defined range. This is because the carrier blocking effect at the interface is more readily exerted between more closely disposed layers, especially in a layered structure.

Moreover, the above-mentioned layer structure is preferably applied when a hole injection transport layer containing the thiophene polymer according to the invention is a first hole injection transport layer. More particularly, a layer containing a hole injection transport compound as mentioned above is formed on the first hole injection transport layer as a second hole injection transport layer, and a layer containing an electron injection transport compound as mentioned above is further formed thereon.

With this construction, the effect of stabilizing the element is obtained as well as the carrier blocking effect.

The electron injection transport compounds may be selected from the above-mentioned electron injection transport materials and the hole injection transport compounds may be selected from the above-mentioned hole injection transport materials. In some cases, they may be selected from the thiophene polymers according to the invention. The electron and hole injection transport compounds may be used alone or in admixture of two or more.

When each layer contains two or more electron or hole injection transport compounds, the Ip or Ea difference mentioned above is generally determined for those compounds which are major components (typically having a content of more than 50% by weight).

It is preferred that either one of the Ip and Ea differences be within the above-defined range while it is most preferred that both the Ip and Ea differences be within the above-defined range. Particularly when tris(8-quinolinolato)aluminum is used as an electron injection transport material, the Ip difference should preferably be within the above-defined range.

The upper limit of the Ip or Ea difference is not critical, but is usually about 1 eV. It is then preferred that the Ip and Ea differences be in the range of 0.2 to 1 eV.

The hole injection transport materials used herein generally have an ionization potential Ip of less than 5.4 eV in absolute value, which value is preferred particularly when they are used in combination with tris(8-quinolinolato)aluminum. The lower limit of ionization potential Ip is not critical although it is generally about 4.8 eV. An ionization potential Ip in the range of 4.8 to 5.4 eV is thus preferred.

Also preferably, the hole injection transport materials have an electron affinity Ea of about 1.8 to 3.0 eV in absolute value.

On the other hand, the electron injection transport material used in combination with the hole injection transport material is preferably selected from those materials having an ionization potential Ip of 5.4 to 6.5 eV and an electron affinity Ea of 2.5 to 3.5 eV both in absolute value.

Especially for the above-mentioned construction, it is preferred to use tris(8-quinolinolato)aluminum as an electron injection transport material. This complex has an ionization potential Ip of about 5.6 to 5.7 eV and an electron affinity Ea of about 2.9 to 3.0 eV both in absolute value.

The following combinations of an hole injection transport material and an electron injection transport material are preferred for the above-mentioned construction.

TABLE 4

| | Electron injection transport material | Hole injection transport material |
|---|---|---|
| (1) | tris(8-quinolinolato) aluminum | N,N'-bis(m-methylphenyl)-N,N'-diphenyl-1,1'-biphenyl-4,4'-diamine |
| (2) | tris(8-quinolinolato) aluminum | 1,1-bis(4-di-p-tolylaminophenyl)cyclohexane |
| (3) | tris(8-quinolinolato) aluminum | N,N'-bis(p-tert-butylphenyl)-N,N'-diphenyl-1,1'-biphenyl-4,4'-diamine |
| (4) | tris(8-quinolinolato) aluminum | N,N'-bis(p-n-butylphenyl)-N,N'-diphenyl-1,1'-biphenyl-4,4'-diamine |

In the practice of the invention, it is preferred to provide a mix layer containing a mixture of a hole injection transport material and an electron injection transport material. Since carrier hopping conduction paths are created in the mix layer, each carrier moves through a polarly predominant material. More particularly, holes move through a hole injection transport solid and electrons move through an electron injection transport solid while injection of carriers of opposite polarity is rather inhibited. The respective organic compounds are less susceptible to damage and few carrier or exciton deactivating points are created in the carrier recombination region or light emitting region. As a result, stable light emission is accomplished and the life is substantially extended.

The mix layer is preferably a light emitting layer, with one or both of the electron injection transport compound and hole injection transport compound preferably having a light emitting function too.

In the mix layer, the electron injection transport compound and hole injection transport compound are preferably mixed such that the weight ratio of electron injection transport compound to hole injection transport compound may range from about 70:30 to about 30:70, more preferably from about 60:40 to about 40:60, especially about 50:50 although the ratio varies with carrier mobility.

For this mixture, an electron injection transport compound may be selected from the above-mentioned electron injection transport materials and a hole injection transport compound may be selected from the above-mentioned hole injection transport materials. If desired, any of the thiophene polymers according to the invention may be selected. In the mix layer, each of the electron injection transport compound and hole injection transport compound may be used alone or in admixture of two or more. The mix layer may be doped with a fluorescent material for enhancing luminous intensity. Rubrene is a preferred fluorescent material.

The difference in ionization potential Ip or difference in electron affinity Ea between the electron injection transport compound and the hole injection transport compound used in the mix layer or both should preferably be at least 0.2 eV. By establishing an Ip or Ea difference in this range between the compounds, not only the carrier blocking effect mentioned above is obtained, but also the effect of respective carriers moving through a polarly predominant material is increased for providing more stable light emission and prolonging the element life.

Preferably either one, most preferably both of ionization potential difference and electron affinity difference fall in the above-defined range. It is preferred that the Ip difference is in the above-defined range when tris(8-quinolinolato)aluminum is used as an electron injection transport material. In addition to these preferred choices, the upper limit of the Ip and Ea differences, the absolute values of Ip and Ea, the use of tris(8-quinolinolato)aluminum as an electron injection transport material, and preferred combinations of a hole injection transport material and an electron injection transport material are the same as described above.

In the aforementioned embodiment of the invention having a mix layer, it is preferred that the mix layer serve as a light emitting layer and be interposed between the electron injection transport layer and the hole injection transport layer. More preferably, the mix layer is formed of a mixture of the electron injection transport compound and the hole injection transport compound of which the adjacent layers are formed. The embodiment wherein a layer containing a mixture of carrier transport materials becomes a light emitting layer has advantages including a lower carrier injection barrier, a wider permissible range of film thickness, easy control, and an increased degree of freedom of emission color. Further preferably, the hole injection transport layer is provided as a second hole injection transport layer on a first hole injection transport layer which is composed of an inventive thiophene polymer as a hole injection transport material.

Preferably the mix layer is formed by co-evaporation, that is, by evaporating the compounds from distinct sources. If both the compounds have equal or close vapor pressure or evaporation temperature, they may be pre-mixed in a common evaporation boat, from which they are evaporated together.

In the mix layer, preferably both the compounds are uniformly mixed although the compounds can be present in island form. The thickness of the mix layer preferably ranges from the thickness corresponding to a single molecule layer to less than the thickness of an organic compound layer. More particularly the mix layer has a thickness of from about 1 to about 85 nm, more preferably 5 to 60 nm, most preferably 5 to 50 nm. Preferably the mix layer forms part of organic compound layers included in the element. If all the organic compound layers are mix layers, the element sometimes fails to provide uniform light emission at high luminance.

It is to be noted that the ionization potential Ip is determined by evaporating a compound onto a glass substrate having an ITO transparent electrode or slide glass to form a compound mono-layer film of about 10 to 200 nm thick and measuring the ionization potential of the sample film by means of a low energy electron spectrometer Surface Analyzer Model AC-1 manufactured by Riken Keiki Co., Ltd. according to Shirahashi, Isobe & Uda, Electronic Parts and Materials, 123 (1985).

Figure 2:
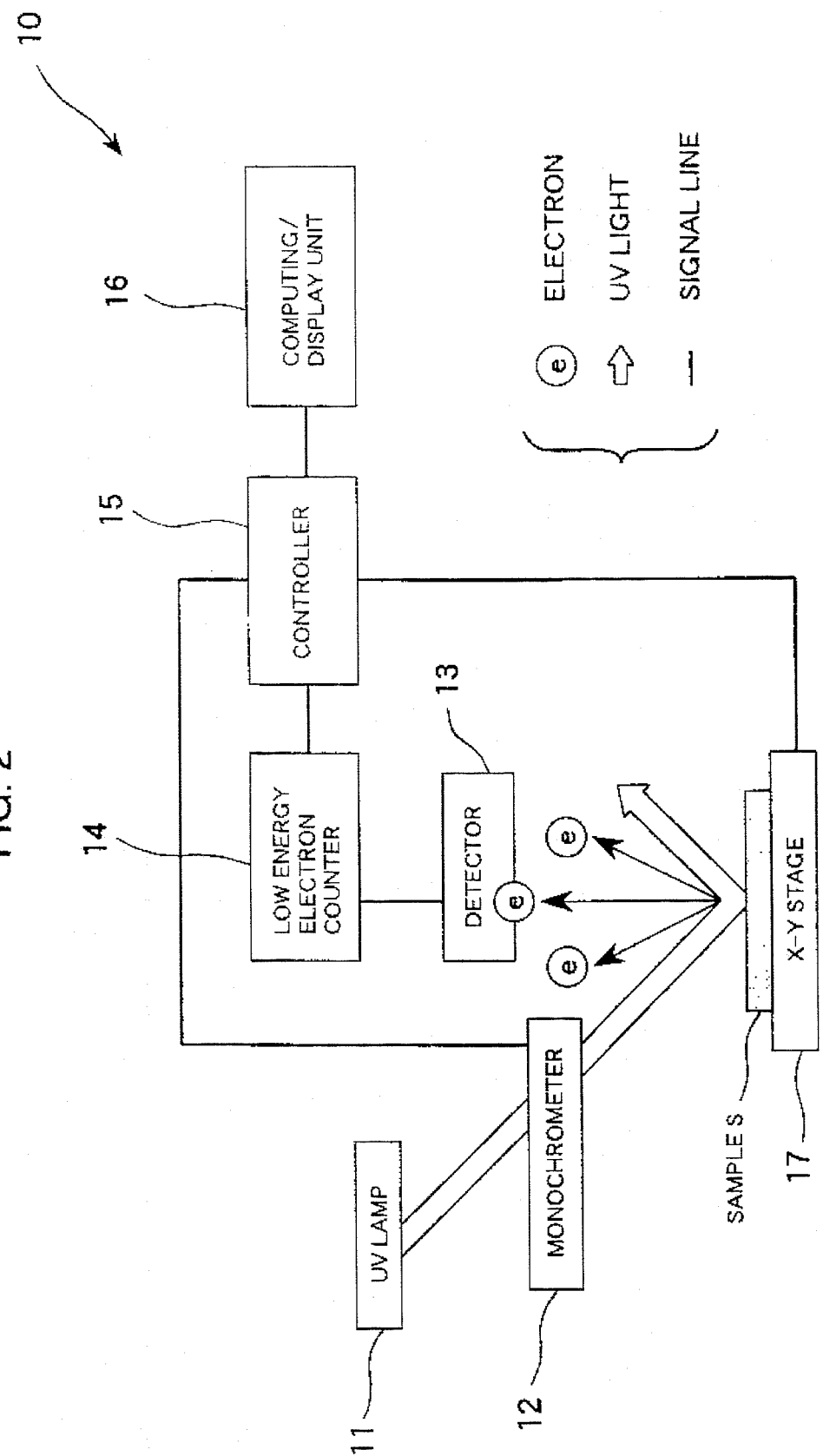
FIG. 2 is a block diagram showing a low energy electron spectrometer system.

FIG. 2 shows the construction of the low energy electron spectrometer system. The spectrometer generally designated at 10 includes a ultraviolet lamp 11, a monochrometer 12, a detector 13, a low energy electron counter 14, a controller 15, a computing/display unit 16, and an X-Y stage 17. On measurement, a sample S rests on the X-Y stage 17.

Figure 3:
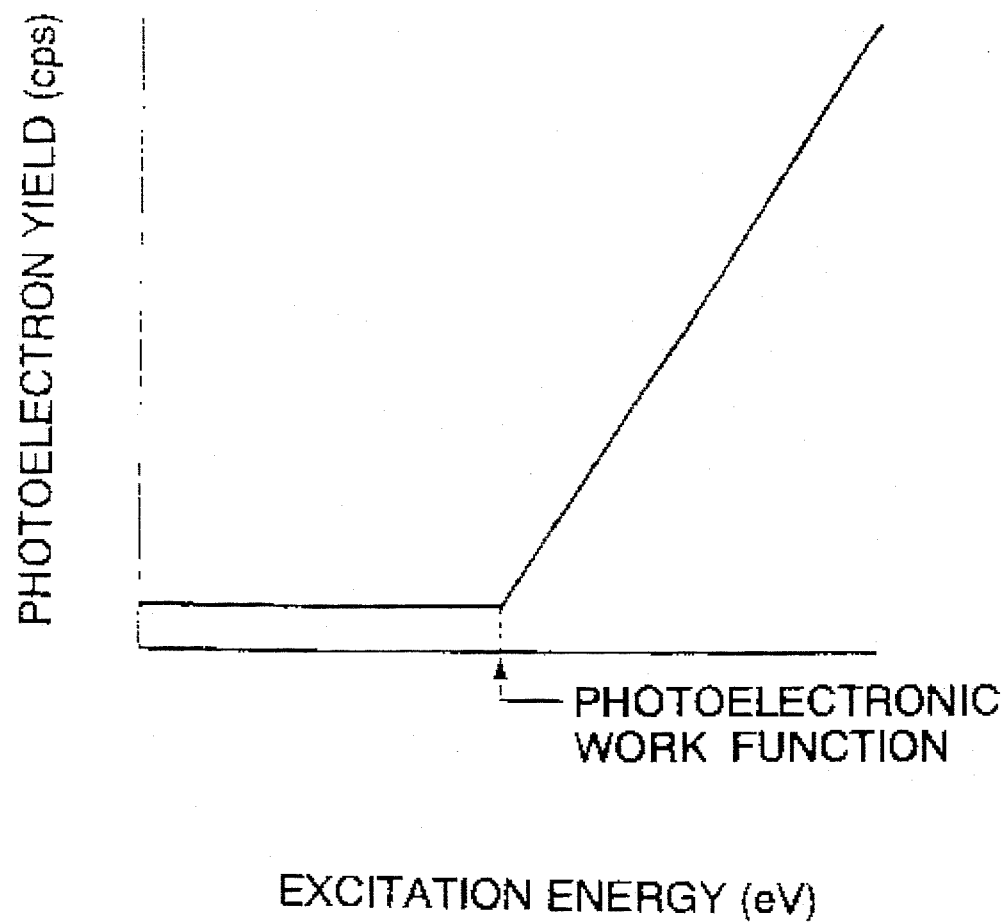
FIG. 3 is a graph showing a photoelectron yield as a function of excitation energy.

The UV lamp 11 in the form of a deuterium discharge lamp emits UV radiation toward the monochrometer 12 through which a light beam having a wavelength of 200 to 360 nm is passed and directed to the surface of the sample S. The light beam having a wavelength of 200 to 360 nm has an energy of 6.2 to 3.4 eV as converted according to the equation: $E=h\nu=h(c/\lambda)$ wherein E is an energy, h is Planck's constant, $\nu$ is a frequency, and $\lambda$ is a wavelength. When the light is swept from a lower excitation energy level to a higher excitation energy level, electron emission due to the photoelectric effect starts at a certain energy level. This energy level is generally known as a photoelectric work function. The thus emitted photoelectrons are detected and counted by the detector 13 and the low energy electron counter 14. The count is subject to arithmetic operations including a background correction and a correction for a count loss during a dead time and then displayed on the display unit 16 for indicating an electron emission as a function of excitation energy (basic characteristic) as shown in FIG. 3. As seen from the basic characteristic, the relationship between the photoelectron yield (count per second, cps) and the excitation energy (eV) is linear provided that a n factorial of photoelectron yield $(cps)^n$ is on the ordinate and the excitation energy is on the abscissa. The value of n is generally ½. The controller 15 serves for wavelength driving of the monochrometer 12, control of the sample position on the X-Y stage 17, and count control of the low energy electron counter 14.

Therefore, the photoelectron work function obtained from FIG. 3 is the ionization potential Ip used herein.

The electron affinity Ea used herein is determined from a spectroscopic measurement, more particularly by calculating an energy gap from the absorption edge of a UV absorption spectrum.

In the practice of the invention, the organic compound layer or layers are preferably doped with rubrene. Doping may be carried out throughout the organic compound layer, preferably throughout the hole injection transport layer. As will be described later, it is believed preferable that rubrene be present in a carrier recombination region, a light emitting region and the proximity thereof, for example, the interface of an organic compound layer in contact with a hole injection transport layer. Then doping need not necessarily be carried out throughout the hole injection transport layer. Therefore doping may be limited to a half area of the hole injection transport layer which is disposed adjacent to the light emitting layer (which may also serve as an electron injection transport layer) or the electron injection transport layer (where the hole injection transport layer also serves as a light emitting layer) although doping is generally carried out throughout the hole injection transport layer. In some cases, doping may be carried out throughout the hole injection transport layer or a half area of the hole injection transport layer which is disposed adjacent to the light emitting layer or the electron injection transport layer and a half region of the light emitting layer or electron injection transport layer which is disposed adjacent to the hole injection transport layer. Combined use of a hole injection transport material and rubrene is preferred particularly in the hole injection transport layer. It is most preferred to form a second hole injection transport layer doped with rubrene on a first hole injection transport layer using a thiophene polymer according to the invention.

The doping concentration of rubrene is preferably 0.1 to 50% by weight, more preferably 0.1 to 30% by weight, most preferably 0.1 to 20% by weight of the layer to be doped because higher concentrations of rubrene can cause concentration quenching.

As previously mentioned, according to the invention, since the difference in ionization potential Ip or the difference in electron affinity Ea between a layer containing a hole injection transport compound such as a hole injection transport layer and a layer containing an electron injection transport compound such as an electron injection transport layer or both are optimized, the carrier blocking effect at the interface is enhanced and injection of polarly inferior or unstable carriers is less probable. The organic compounds in the respective layers are less susceptible to damage and few points of deactivation of carriers or excitons are created in the carrier recombination region or light emitting region. Where an organic compound layer is additionally doped with rubrene, which has a bipolar transport ability and allows for carrier recombination, the damage to the organic compound is accordingly reduced. Further, since rubrene is present in the proximity of the carrier recombination region, energy transfer from excitons to rubrene takes place to reduce non-radiative deactivation, resulting in stable light emission and a significantly extended life.

In the practice of the invention, rubrene is preferably used as a fluorescent material. It is acceptable to dope with another fluorescent material.

In the practice of the invention, the cathode is preferably made of a material having a low work function, for example, Li, Na, Mg, Al, Ag, In and alloys containing at least one of these metals. The cathode should preferably be of fine grains, especially amorphous. The cathode is preferably about 10 to 1,000 nm thick.

In order that the EL element produce plane light emission, at least one of the electrodes should be transparent or semi-transparent. Since the material of the cathode is limited as mentioned just above, it is preferred to select the material and thickness of the anode so as to provide a transmittance of at least 80% to the emitted radiation. For example, the anode is preferably made of indium tin oxide (ITO), $SnO_2$, Ni, Au, Pt, Pd, and doped polypyrrole. The anode preferably has a thickness of about 10 to 500 nm. In order that the element be more reliable, the drive voltage should be low. For example, ITO having 10 to 30 $\Omega/$ is preferred.

The substrate may be made of any desired material although a transparent or semi-transparent material such as glass and resins is used in the illustrated embodiment wherein light exits from the substrate side. The substrate may be provided with a color filter layer or dielectric reflecting film for controlling emission light color. Where the substrate is made of an opaque material, the layer stacking order may be reversed from that shown in FIG. 1.

Next, it is described how to prepare the EL element using polythiophene of the present invention. The cathode and anode are preferably formed by gas phase deposition techniques such as vacuum evaporation and sputtering. The light emitting layer and hole and electron injection transport layers are preferably formed by vacuum evaporation because homogeneous thin films are available. Then thin films of about 1 to 10 nm thick can be uniform and pinhole-free, which restrains any change in color tone of light emission and a drop of efficiency by reabsorption. By utilizing vacuum evaporation, there is obtained a homogeneous thin film which is amorphous or has a grain size of less than 0.1 μm. If the grain size is more than 0.1 μm, uneven light emission takes place and the drive voltage of the element must be increased with a substantial lowering of electric charge injection efficiency. The lower limit of grain size is not critical although it is generally about 0.001 μm.

The conditions for vacuum evaporation are not critical although a vacuum of $10^{-5}$ Torr ($10^{-3}$ Pa) or lower and an evaporation rate of about 0.1 to 1 nm/sec. are preferred. It is preferred to successively form layers in vacuum because the successive formation in vacuum can avoid adsorption of impurities at the interface between the layers, thus ensuring high quality and a lower drive voltage.

In the embodiment wherein the respective layers are formed by vacuum evaporation, where it is desired for a single layer to contain two or more compounds, boats having the compounds received therein are individually temperature controlled to achieve co-deposition.

When the thiophene polymer is evaporated according to the invention, it is preferably deposited as comprising 5 to 40 monomer units, more preferably 5 to 20 monomer units. The deposit can be identified by infrared absorption spectroscopy (IR), liquid chromatography, gel permeation chromatography (GPC), mass spectroscopy, fluorescent spectroscopy, absorption spectroscopy, etc. More particularly, the deposit is dissolved in an organic solvent such as toluene before such analysis is done.

The EL element of the invention is generally of the DC drive type while it can be of the AC or pulse drive type. The applied voltage is generally about 2 to 20 volts.

EXAMPLE

Examples of the present invention are given below by way of illustration and not by way of limitation.

Example 1

A glass substrate having an ITO transparent electrode (anode) of 100 nm thick was subjected to ultrasonic cleaning with neutral detergent, acetone, and ethanol, pulled up from boiling ethanol, and dried. The substrate was secured by a holder in an evaporation apparatus, which was evacuated to a vacuum of $1\times10^{-6}$ Torr ($1.3\times10^{-4}$ Pa).

Then polymer III-1 in Table 3 or poly(thiophene-2,5-diyl) was evaporated at a deposition rate of 0.2 nm/sec. to a thickness of 30 nm, forming a hole injection transport layer.

With the vacuum kept, tris(8-quinolinolato) aluminum was evaporated at a deposition rate of 0.2 nm/sec. to a thickness of 50 nm, forming a light emitting layer which also served as an electron injection transport layer.

With the vacuum kept, MgAg (weight ratio 10:1) was evaporated at a deposition rate of 0.2 nm/sec. to a thickness of 200 nm to form a cathode, obtaining an EL element.

Electric current was conducted across the EL element with voltage applied. With a voltage of 7 V and a current density of 100 mA/cm$^2$, emission of yellowish green light (maximum wavelength λmax=501 nm) at a luminance of 500 cd/m$^2$ was observed. This light emission continued stably over 3,000 hours in a dry nitrogen atmosphere without development or growth of local dark spots.

Example 2

A glass substrate having an ITO transparent electrode (anode) of 100 nm thick was subjected to ultrasonic cleaning with neutral detergent, acetone, and ethanol, pulled up from boiling ethanol, and dried. The substrate was secured by a holder in an evaporation apparatus, which was evacuated to a vacuum of $1\times10^{-6}$ Torr ($1.3\times10^{-4}$ Pa).

Then polymer I-1 in Table 1 or poly(thiophene-2,4-diyl) was evaporated at a deposition rate of 0.2 nm/sec. to a thickness of 30 nm, forming a hole injection transport layer.

With the vacuum kept, tris(8-quinolinolato)aluminum was evaporated at a deposition rate of 0.2 nm/sec. to a thickness of 50 nm, forming a light emitting layer which also served as an electron injection transport layer, that is, an electron injection transport/light emitting layer.

With the vacuum kept, MgAg (weight ratio 10:1) was evaporated at a deposition rate of 0.2 nm/sec. to a thickness of 200 nm to form a cathode, obtaining an EL element.

Electric current was conducted across the EL element with voltage applied. With a voltage of 8 V and a current density of 100 mA/cm$^2$, emission of yellowish green light (maximum wavelength λmax=500 nm) at a luminance of 800 cd/m$^2$ was observed. This light emission continued stably over 3,000 hours in a dry nitrogen atmosphere without development or growth of local dark spots.

Example 3

A glass substrate having an ITO transparent electrode (anode) of 100 nm thick was subjected to ultrasonic cleaning with neutral detergent, acetone, and ethanol, pulled up from boiling ethanol, and dried. The substrate was secured by a holder in an evaporation apparatus, which was evacuated to a vacuum of $1\times10^{-6}$ Torr ($1.3\times10^{-4}$ Pa).

Then polymer III-1 in Table 3 or poly(thiophene-2,5-diyl) was evaporated and deposited to a thickness of 10 nm, forming a first hole injection transport layer.

Then N,N'-bis(m-methylphenyl)-N,N'-diphenyl-1,1'-biphenyl-4,4'-diamine (TPD) was evaporated and deposited to a thickness of 50 nm, forming a second hole injection transport layer.

With the vacuum kept, tris(8-quinolinolato)aluminum was evaporated at a deposition rate of 0.2 nm/sec. to a thickness of 50 nm, forming an electron injection transport/ light emitting layer.

With the vacuum kept, MgAg (weight ratio 10:1) was evaporated at a deposition rate of 0.2 nm/sec. to a thickness of 200 nm to form a cathode, obtaining an EL element.

Electric current was conducted across the EL element with voltage applied. With a voltage of 7 V and a current density of 100 mA/cm$^2$, emission of yellowish green light (maximum wavelength λmax=500 nm) at a luminance of 3,000 cd/m$^2$ was observed. This light emission continued stably up to 1,000 hours in a dry nitrogen atmosphere without development or growth of local dark spots. Ten elements of this construction was operated to emit light whereupon no current leakage occurred.

Example 4

An EL element was fabricated by the same procedure as in Example 1 except that using m-bis[2-(4-tert-butylphenyl)-1,3,4-oxadiazole] benzene as an electron injection transport material, an electron injection transport layer was formed in addition to the light emitting layer of tris(8-quinolinolato)aluminum. The light emitting layer was 50 nm thick and the electron injection transport layer was 10 nm thick. The electron injection transport layer was formed by evaporation like the light emitting layer.

As in Example 1, favorable results were obtained with this element.

Comparative Example 1

A glass substrate having an ITO transparent electrode (anode) of 100 nm thick was subjected to ultrasonic cleaning with neutral detergent, acetone, and ethanol, pulled up from boiling ethanol, and dried. The substrate was secured by a holder in an evaporation apparatus, which was evacuated to a vacuum of 1×10$^{-6}$ Torr (1.3×10$^{-4}$ Pa).

Then N,N'-bis(m-methylphenyl) -N,N'-diphenyl-1,1'-biphenyl-4,4'-diamine (TPD) was evaporated and deposited to a thickness of 50 nm, forming a hole injection transport layer.

With the vacuum kept, tris(8-quinolinolato)aluminum was evaporated at a deposition rate of 0.2 nm/sec. to a thickness of 50 nm, forming an electron injection transport/ light emitting layer.

With the vacuum kept, MgAg (weight ratio 10:1) was evaporated at a deposition rate of 0.2 nm/sec. to a thickness of 200 nm to form a cathode, obtaining an EL element.

Electric current was conducted across the EL element with voltage applied. With a voltage of 18 V and a current density of 100 mA/cm$^2$, emission of yellowish green light (maximum wavelength λmax=505 nm) at a luminance of 2,500 cd/m$^2$ was observed. When light emission continued for 100 hours in a dry nitrogen atmosphere, local dark spots developed and grew. Ten elements of this construction were operated to emit light. In all the elements, current leakage and a substantial drop of luminance occurred within 300 hours.

Example 5

A glass substrate having an ITO transparent electrode (anode) of 100 nm thick was subjected to ultrasonic cleaning with neutral detergent, acetone, and ethanol, pulled up from boiling ethanol, and dried. The substrate was secured by a holder in an evaporation apparatus, which was evacuated to a vacuum of 1×10$^{-6}$ Torr (1.3×10$^{-4}$ Pa).

Then polymer III-1 in Table 3 or poly(thiophene-2,5-diyl) was evaporated at a deposition rate of about 0.1 nm/sec. to a thickness of about 10 nm, forming a first hole injection transport layer.

Then 1,1-bis(4-di-p-tolylaminophenyl)cyclohexane was evaporated at a deposition rate of 0.1 to 0.2 nm/sec. to a thickness of about 50 nm, forming a second hole injection transport layer.

With the vacuum kept, tris(8-quinolinolato)aluminum was evaporated at a deposition rate of 0.1 to 0.2 nm/sec. to a thickness of about 50 nm, forming an electron injection transport/light emitting layer.

With the vacuum kept, MgAg (weight ratio 10:1) was evaporated at a deposition rate of 0.2 nm/sec. to a thickness of 200 nm to form a cathode, obtaining an EL element.

With a DC voltage applied across the EL element, it was continuously driven in a dry atmosphere at a constant current density of 10 mA/cm$^2$. With a voltage of 7.0 V, emission of yellowish green light (maximum wavelength λmax=500 nm) at a luminance of 300 cd/m$^2$ was observed initially. The element had a half life of luminance of 24 hours while the drive voltage increased 2.1 V.

Comparative Example 2

A glass substrate having an ITO transparent electrode (anode) of 100 nm thick was subjected to ultrasonic cleaning with neutral detergent, acetone, and ethanol, pulled up from boiling ethanol, and dried. The substrate was secured by a holder in an evaporation apparatus, which was evacuated to a vacuum of 1×10$^{-6}$ Torr (1.3×10$^{-4}$ Pa).

Then 1,1-bis(4-di-p-tolylaminophenyl)cyclohexane was evaporated at a deposition rate of 0.2 nm/sec. to a thickness of 50 nm, forming a hole injection transport layer.

With the vacuum kept, tris(8-quinolinolato)aluminum was evaporated at a deposition rate of 0.2 nm/sec. to a thickness of 50 nm, forming an electron injection transport/ light emitting layer.

With the vacuum kept, MgAg (weight ratio 10:1) was evaporated at a deposition rate of 0.2 nm/sec. to a thickness of 200 nm to form a cathode, obtaining an organic EL element.

With a DC voltage applied across the EL element, it was continuously driven in a dry atmosphere at a constant current density of 10 mA/cm$^2$. With a voltage of 8.5 V, emission of yellowish green light (maximum wavelength λmax=500 nm) at a luminance of 360 cd/m$^2$ was observed initially. The drive voltage increased to 11.5 V after 3 hours and dielectric breakdown occurred after 19 hours.

Example 6

A glass substrate having an ITO transparent electrode (anode) of 200 nm thick was subjected to ultrasonic cleaning with neutral detergent, acetone, and ethanol. It was pulled up from boiling ethanol, dried, and cleaned with UV/O$_3$. It was secured by a holder in an evaporation apparatus, which was evacuated to a vacuum of lower than 1×10$^{-4}$ Pa.

Then polymer III-1 or poly(thiophene-2,5-diyl) was evaporated at a deposition rate of about 0.1 nm/sec. to a thickness of about 20 nm to form a first hole injection transport layer.

The vacuum chamber resumed the ambient atmosphere and was evacuated again to a vacuum of lower than 1×10$^{-4}$ Pa. Then N,N'-bis(m-methylphenyl)-N,N'-diphenyl-1,1'-biphenyl-4,4'-diamine (TPD) was evaporated at a deposition rate of 0.1 to 0.2 nm/sec. to a thickness of about 55 nm to form a second hole injection transport layer.

With the vacuum kept, tris(8-quinolinolato)aluminum was evaporated at a deposition rate of 0.1 to 0.2 nm/sec. to a thickness of about 50 nm to form an electron injection transport/light emitting layer.

With the vacuum kept, MgAg (weight ratio 10:1) was evaporated at a deposition rate of 0.2 nm/sec. to a thickness of about 200 nm to form a cathode, obtaining an EL element.

With a DC voltage applied across the EL element, it was continuously driven in a dry atmosphere at a constant current density of 10 mA/cm$^2$. With a voltage of 5.6 V, emission of yellowish green light (maximum wavelength $\lambda$max=500 nm) at a luminance of 210 cd/m$^2$ was observed initially. The element had a half life of luminance of 130 hours while the drive voltage increased 1.8 V. Neither development or growth of local dark spots occurred. Stable light emission continued thereafter with no current leakage.

Example 7

In Example 6, the second hole injection transport layer was formed to a thickness of about 35 nm. With the vacuum kept, the same hole injection transport material (TPD) as used in the second hole injection transport layer and tris(8-quinolinolato)aluminum as an electron injection transport material were co-evaporated at an equal deposition rate of 0.1 to 0.2 nm/sec. to form a mix layer of about 40 nm thick. This mix layer was a light emitting layer.

Thereafter as in Example 6, an electron injection transport layer of about 30 nm thick was formed from tris(8-quinolinolato)aluminum and a cathode formed, completing an EL element.

As in Example 6, the EL element was continuously driven in a dry atmosphere at a constant current density of 10 mA/cm$^2$. With a voltage of 6.9 V, emission of yellowish green light (maximum wavelength $\lambda$max=505 run) at a luminance of 280 cd/m$^2$ was observed initially. The element had a half life of luminance of 1,050 hours while the drive voltage increased 3.2 V. Neither development or growth of local dark spots occurred. Stable light emission continued thereafter with no current leakage.

The mix layer contained N,N'-bis(m-methylphenyl)-N,N'-diphenyl-1,1'-biphenyl-4,4'-diamine (TPD) and tris(8-quinolinolato)aluminum. The TPD had an ionization potential Ip of 5.40 eV and an electron affinity Ea of 2.40 eV both in absolute value. The tris(8-quinolinolato)aluminum had an ionization potential Ip of 5.64 eV and an electron affinity Ea of 2.95 eV both in absolute value. Note that the ionization potential Ip was determined by evaporating the relevant compound onto a glass substrate at a deposition rate of 0.2 nm/sec. to form a sample film of about 10 nm thick and measuring the ionization potential of the sample film by means of a low energy electron spectrometer AC-1 manufactured by Riken Keiki Co., Ltd. and that the electron affinity Ea was determined from a UV absorption spectrum.

Polymer III-1 had an ionization potential Ip of 5.0 eV in absolute value.

Example 8

An EL element was fabricated by the same procedure as in Example 7 except that the mix layer was 20 nm thick.

The element was similarly examined for performance. With a voltage of 6.1 V, emission of yellowish green light (maximum wavelength $\lambda$max=500 nm) at a luminance of 280 cd/m$^2$ was observed initially. The element had a half life of luminance of 1,000 hours while the drive voltage increased 3.1 V. Neither development or growth of local dark spots occurred. Stable light emission continued thereafter with no current leakage.

Example 9

An EL element was fabricated by the same procedure as in Example 7 except that the mix layer was 10 nm thick.

The element was similarly examined for performance. With a voltage of 6.4 V, emission of yellowish green light (maximum wavelength $\lambda$max=500 nm) at a luminance of 290 cd/m$^2$ was observed initially. The element had a half life of luminance of 800 hours while the drive voltage increased 3.0 V. Neither development or growth of local dark spots occurred. Stable light emission continued thereafter with no current leakage.

Example 10

An EL element was fabricated by the same procedure as in Example 7 except that the mix layer was 5 nm thick.

The element was similarly examined for performance. With a voltage of 6.0 V, emission of yellowish green light (maximum wavelength $\lambda$max=500 nm) at a luminance of 250 cd/m$^2$ was observed initially. The element had a half life of luminance of 500 hours while the drive voltage increased 2.6 V. Neither development or growth of local dark spots occurred. Stable light emission continued thereafter with no current leakage.

It is evident from the results of Examples 6–10 that the provision of a mix layer is effective for increasing the initial luminance and extending the half life.

EL elements were fabricated as in Examples 6 and 7 using compound combinations (2) to (4) in Table 4 instead of combination (1) and examined for performance. Elements of the layer structure and elements having a mix layer showed similar tendency as mentioned above.

Example 11

A glass substrate having an ITO transparent electrode (anode) of 200 nm thick was subjected to ultrasonic cleaning with neutral detergent, acetone, and ethanol. It was pulled up from boiling ethanol, dried, and cleaned with UV/O$_3$. It was secured by a holder in an evaporation apparatus, which was evacuated to a vacuum of lower than 1×10$^{-4}$ Pa.

Then poly(thiophene-2,5-diyl) was evaporated at a deposition rate of about 0.1 nm/sec. to a thickness of about 20 nm to form a first hole injection transport layer.

The vacuum chamber resumed the ambient atmosphere and was evacuated again to a vacuum of lower than 1×10$^{-4}$ Pa. Then N,N'-bis(m-methylphenyl)-N,N'-diphenyl-1,1'-biphenyl-4,4'-diamine (TPD) and rubrene were co-evaporated at a deposition rate of 0.1 to 0.2 nm/sec. and 0.01 to 0.02 nm/sec., respectively, to a total thickness of about 55 nm, forming a second hole injection transport layer.

With the vacuum kept, tris(8-quinolinolato)aluminum was evaporated at a deposition rate of 0.1 to 0.2 nm/sec. to a thickness of about 50 nm, forming an electron injection transport/light emitting layer.

With the vacuum kept, MgAg (weight ratio 10:1) was evaporated at a deposition rate of 0.2 nm/sec. to a thickness of about 200 nm to form a cathode, obtaining an EL element.

With a DC voltage applied across the EL element, it was continuously driven in a dry atmosphere at a constant current density of 10 mA/cm². With a voltage of 5.3 V, emission of yellow light (maximum wavelength λmax=550 nm) at a luminance of 290 cd/m² was observed initially. The element had a half life of luminance of 260 hours while the drive voltage increased 1.6 V.

It is thus evident that doping of rubrene is effective for increasing the initial luminance and extending the half life.

In Examples 1–11, EL elements were fabricated by using at least one of the polymers and copolymers listed in Tables 1 to 3 instead of the above-mentioned polymers in the hole injection transport layer, with equivalent results obtained.

These polymers and copolymers had an ionization potential Ip of 4.8 to 5.4 eV in absolute value. When they were combined with N,N'-bis(m-methylphenyl)-N,N'-diphenyl-1,1'-biphenyl-4,4'-diamine or 1,1-bis(4-p-tolylaminophenyl)cyclohexane having an ionization potential Ip of 5.40 eV in absolute value as a second hole injection transport compound, a compound adequate for a first hole injection transport layer was available.

Example 12

A glass substrate having an ITO transparent electrode (anode) of 100 nm thick was subjected to ultrasonic cleaning with neutral detergent, acetone, and ethanol, pulled up from boiling ethanol, and dried. The substrate was secured by a holder in an evaporation apparatus, which was evacuated to a vacuum of 1×10⁻⁶ Torr (1.3×10⁻⁴ Pa).

Then polymer I-1 in Table 1 or poly(thiophene-2,4-diyl) was evaporated at a deposition rate of 0.2 nm/sec. to a thickness of 300 nm, forming a light emitting layer.

With the vacuum kept, MgAg (weight ratio 10:1) was evaporated at a deposition rate of 0.2 nm/sec. to a thickness of 200 nm to form a cathode, obtaining an EL element.

Electric current was conducted across the EL element with voltage applied. With a voltage of 11 V and a current density of 100 mA/cm², emission of blue light (maximum wavelength λmax=480 nm) at a luminance of 10 cd/m² was observed. This light emission continued stably over 1,000 hours in a dry nitrogen atmosphere.

Example 13

A glass substrate having an ITO transparent electrode (anode) of 100 nm thick was subjected to ultrasonic cleaning with neutral detergent, acetone, and ethanol, pulled up from boiling ethanol, and dried. The substrate was secured by a holder in an evaporation apparatus, which was evacuated to a vacuum of 1×10⁻⁶ Torr (1.3×10⁻⁴ Pa).

Then copolymer II-1 in Table 2 or thiophene-2,4-diyl/thiophene-2,5-diyl copolymer was evaporated at a deposition rate of 0.2 nm/sec. to a thickness of 30 nm, forming a light emitting layer.

With the vacuum kept, MgAg (weight ratio 10:1) was evaporated at a deposition rate of 0.2 nm/sec. to a thickness of 200 nm to form a cathode, obtaining an EL element.

Electric current was conducted across the EL element with voltage applied. With a voltage of 10 V and a current density of 100 mA/cm², emission of yellowish green light (maximum wavelength λmax=530 nm) at a luminance of 10 cd/m² was observed. This light emission continued stably over 1,000 hours in a dry nitrogen atmosphere without development or growth of local dark spots.

In Examples 12 and 13, EL elements were fabricated by using at least one of the polymers and copolymers listed in Tables 1 to 3 instead of the above-mentioned polymer or copolymer in the light emitting layer, with equivalent results obtained.

It is thus evident that EL elements using polythiophene as defined herein operate in a reliable manner without current leakage and development or growth of local dark spots.

There have been described EL elements using polythiophene which can emit light with a high luminance in a stable manner. The elements are fully heat resistant and durable and ensure stable driving. Light emission is uniform, free of variations, efficient, and available with a low voltage. Those elements using a mix layer as a light emitting layer experience no drop of initial luminance and have an extended life of light emission. Those elements having a rubrene doped layer are improved in initial luminance and have an extended life of light emission.

Japanese Patent Application Nos. 248629/1993 (filed Sep. 9, 1993) and 170312/1994 (filed Jun. 29, 1994) are incorporated herein by reference.

Although some preferred embodiments have been described, many modifications and variations may be made thereto in the light of the above teachings. It is therefore to be understood that within the scope of the appended claims, the invention may be practiced otherwise than as specifically described.

We claim:

1. An electroluminescent element comprising at least one layer comprising at least one member selected from a thiophene polymer comprising a structural unit of the following formula (1):

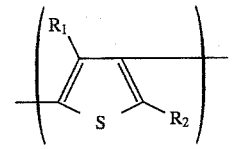

wherein each of $R_1$ and $R_2$, which may be identical or different, is a hydrogen atom, an aromatic hydrocarbon group or an aliphatic hydrocarbon group, and a thiophene copolymer comprising a structural unit of formula (1) and a structural unit of the following formula (2):

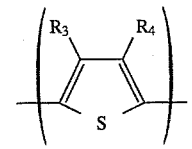

wherein each of $R_3$ and $R_4$, which may be identical or different, is a hydrogen atom, an aromatic hydrocarbon group or an aliphatic hydrocarbon group, or $R_3$ and $R_4$ taken together may form a benzene ring,
the polymer and the copolymer having an average degree of polymerization of 4 to 100 and being terminated with a hydrogen or halogen atom, and
said at least one layer is formed by vacuum evaporation of said thiophene polymer or copolymer.

2. The electroluminescent element of claim 1 wherein said at least one layer is a light emitting layer.

3. The electroluminescent element of claim 2 wherein said light emitting layer also serves as a hole injection transport layer.

4. The electroluminescent element of claim 1 which comprises a hole injection transport layer and a light emitting layer, said hole injection transport layer comprising the thiophene polymer or copolymer.

5. The electroluminescent element of claim 4 which comprises an anode, a first hole injection transport layer, a second hole injection transport layer, a light emitting layer and a cathode in this order, and the first hole injection transport layer comprises the thiophene polymer or copolymer.

6. An electroluminescent element as claimed in claim 5, wherein said light emitting layer comprises at least one thiophene polymer of the following formula (3):

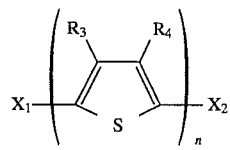

wherein each of $R_3$ and $R_4$, which may be identical or different, is a hydrogen atom, an aromatic hydrocarbon group or an aliphatic hydrocarbon group, or $R_3$ and $R_4$ taken together may form a benzene ring, each of $X_1$ and $X_2$, which may be identical or different, is a hydrogen or halogen atom, letter n is a number from 4 to 100, and said light emitting layer comprising at least one thiophene polymer is formed by vacuum evaporation of polymer.

7. The electroluminescent element of claim 6 wherein said light emitting layer also serves as a hole injection transport layer.

8. The electroluminescent element of claim 4 which further comprises an electron injection transport layer.

9. An electroluminescent element comprising an anode, a first hole injection transport layer, a second hole injection transport layer, a light emitting layer and a cathode in this order, said first hole injection transport layer comprising at least one thiophene polymer of the following formula (3):

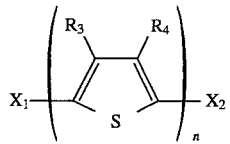

wherein each of $R_3$ and $R_4$, which may be identical or different, is a hydrogen atom, an aromatic hydrocarbon group or an aliphatic hydrocarbon group, or $R_3$ and $R_4$ taken together may form a benzene ring, each of $X_1$ and $X_2$, which may be identical or different, is a hydrogen or halogen atom, letter n is a number from 4 to 100, and said layer comprising at least one thiophene polymer is formed by vacuum evaporation of said polymer.

10. The electroluminescent element of claim 9 which further comprises an electron injection transport layer.

11. The electroluminescent element of any one of claims 4, 5 or 9 which comprises at least one layer containing an electron injection transport compound, the difference in ionization potential Ip or the difference in electron affinity Ea between the thiophene polymer or copolymer and said electron injection transport compound being at least 0.2 eV.

12. The electroluminescent element of claim 11 wherein the thiophene polymer or copolymer has an ionization potential IP of up to 5.4 eV in absolute value.

13. The electroluminescent element of claim 11 wherein said electron injection transport compound is tris(8-quinolinolato)aluminum.

14. The electroluminescent element of claim 1 or 9 which further comprises at least one mix layer containing a mixture of a hole injection transport compound and an electron injection transport compound.

15. The electroluminescent element of claim 14 wherein said mix layer is a light emitting layer.

16. The electroluminescent element of claim 14 wherein the difference in ionization potential IP or the difference in electron affinity Ea between said hole injection transport compound and said electron injection transport compound in said mix layer is at least 0.2 eV.

17. The electroluminescent element of claim 1 or 9 which further comprises a layer doped with a fluorescent material.

18. The electroluminescent element of claim 17 wherein said fluorescent material is rubrene.

* * * * *

UNITED STATES PATENT AND TRADEMARK OFFICE
CERTIFICATE OF CORRECTION

PATENT NO. : 5,540,999
DATED : July 30, 1996
INVENTOR(S) : Takakazu YAMAMOTO, et al.

It is certified that error appears in the above-indentified patent and that said Letters Patent is hereby corrected as shown below:

Column 1, col. 1, line 2, and
On the title page, Item [54], the title, should read:

--EL ELEMENT USING POLYTHIOPHENE--

Signed and Sealed this

Twenty-second Day of October, 1996

Attest:

BRUCE LEHMAN

*Attesting Officer*   *Commissioner of Patents and Trademarks*